(12) United States Patent
Nakano et al.

(10) Patent No.: US 7,202,674 B2
(45) Date of Patent: Apr. 10, 2007

(54) INTEGRATED NON-CONTACT/CONTACT CAPACITANCE SENSOR

(75) Inventors: Ryuichi Nakano, Wako (JP); Hirohide Suda, Wako (JP); Taizo Kikuchi, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/043,324

(22) Filed: Jan. 26, 2005

(65) Prior Publication Data
US 2005/0179445 A1 Aug. 18, 2005

(30) Foreign Application Priority Data
Feb. 16, 2004 (JP) .............................. 2004-038980

(51) Int. Cl.
*G01R 27/26* (2006.01)
(52) U.S. Cl. ...................................... 324/661; 324/663
(58) Field of Classification Search ................ 324/661, 324/662, 674, 675, 682, 663
See application file for complete search history.

(56) References Cited

U.S. PATENT DOCUMENTS

| | | | |
|---|---|---|---|
| 6,538,802 B2 * | 3/2003 | Wang et al. ................ 359/298 |
| 6,700,393 B2 * | 3/2004 | Haag et al. ................. 324/674 |
| 6,940,291 B1 * | 9/2005 | Ozick .......................... 324/658 |
| 6,968,746 B2 * | 11/2005 | Shank et al. .................. 73/780 |
| 2004/0145378 A1 * | 7/2004 | Shoji et al. ................. 324/663 |
| 2005/0012484 A1 * | 1/2005 | Gifford et al. .............. 318/466 |

FOREIGN PATENT DOCUMENTS

JP 2001-32628 2/2001

* cited by examiner

*Primary Examiner*—Walter Benson
(74) *Attorney, Agent, or Firm*—Hamre, Schumann, Mueller & Larson, PC

(57) ABSTRACT

A capacitance sensor of the present invention is equipped with a sensor unit that comprises a pair of detection electrodes, which are connected to respective reference capacitors, are provided with being oppositely separated, and can contact each other; and an insulation member having flexibility by holding at least one detection electrode. And a capacitance type object detection method thereof is an object detection method for detecting an object's nearing: when the object nears, a non-contact sensor detects it with non contact according to a change of a capacitance; and when the object makes contact, a contact sensor, which deforms by the contact of the object, detects it with contact.

16 Claims, 9 Drawing Sheets

INTEGRATED NON-CONTACT/CONTACT CAPACITANCE SENSOR

BACKGROUND OF THE INVENTION

1. Field of the Invention

The present invention relates to a non-contact/contact integrated type of a capacitance sensor for detecting an object's such as a human body nearing or contacting a door and the like of a vehicle.

2. Description of the Related Art

Conventionally, it is known a pinch prevention apparatus that prevents a hand(s) and a finger(s) from being pinched between a movable part of a vehicle such as an automatic open/close power sliding door and power window and a holding part thereof such as a center pillar and window frame for receiving the movable part (for example, see paragraphs 0002 to 0026 and FIG. 1 in Japanese Patent Laid-Open Publication No. 2001-32628). The pinch prevention apparatus is equipped with a capacitance sensor for detecting a human body and is designed to stop the movable part according to a human body detection signal detected by the capacitance sensor or to move the movable part to an opposite direction.

Generally, as shown in FIG. 9A, a capacitance sensor is equipped with a detection electrode E1, a grounding electrode E2, an insulator In pinched between the detection electrode E1 and the grounding electrode E2, and a coating member consisting of an insulation material arranged so as to surround a periphery of the detection electrodes E1 and E2 and the insulator In. And the capacitance sensor is arranged, for example, on an end face at a side of a movable part facing a holding part.

In such the capacitance sensor, as shown in FIG. 9B, an electric charge is supplied to the detection electrode E1 from an electric charge supply circuit through a pulse generation circuit and an output amp. That is, because the detection electrode E1 and the grounding electrode E2 configure a capacitor, an electric potential V output through the detection amp is expressed in a following formula (1):

$$V=Q/(C1+C2), \qquad (1)$$

where Q represents an electric charge charged in an capacitance sensor (capacitor), C1 represents a capacitance of the capacitance sensor itself, and C2 represents a capacitance, stray capacitance between the capacitance sensor and the ground.

And if a human body nears the capacitance sensor, the electric potential V changes according to a capacitance between the capacitance sensor and the human body. That is, the electric potential V is expressed in a following formula (2):

$$V=Q/(C1+C2+C3), \qquad (2)$$

where Q, C1, and C2 are same as in the formula (1), and C3 represents a capacitance between a human body and a capacitance sensor.

Accordingly, the more the human body nears the capacitance sensor the more the C3 augments, and resultingly, the electric potential V output through the detection amp becomes smaller and smaller. In other words, the capacitance sensor is designed to detect the human body according to the change of such the electric potential V.

In this connection, as shown in FIG. 9C, in such the capacitance sensor there is a case that a droplet W adheres to peripheries of the detection electrode E1 and the grounding electrode E2, for example, to the coating member due to rainfall and the like. Because if the droplet W thus adheres to the coating member, the capacitance sensor has the grounding electrode E2, a capacitance thereof increases in an increment of a capacitance Cw of the droplet W.

However, if the capacitance Cw of the capacitance sensor increases, it lowers output of the electric potential V as if a human body nears the capacitance sensor. Accordingly, the pinch prevention apparatus using such the capacitance sensor results in malfunctioning by a disturbance due to the adherence of the droplet W.

Consequently, it is strongly requested a novel non-contact/contact integrated type of a capacitance sensor that can prevent a malfunction by a disturbance due to the adherence of a droplet and the like, can perform an accurate detection when an object such as a human being nears a door and the like of a vehicle, and can surely detect the object also when it directly contacts the door and the like.

SUMMARY OF THE INVENTION

Mechanisms taken to solve the problem described above are following ones that make it a fundamental inventive idea to design: to prevent a malfunction by detecting an object such as a human body through a plurality of detection electrodes provided between the object and themselves so as not to receive an influenced due to a disturbance; and to perform sure and accurate detection by making a structure of the plurality of the electrodes surrounded by a shield electrode.

In a first aspect of a capacitance sensor, it comprises a sensor unit that comprises a pair of detection electrodes, which are connected to respective reference capacitors, are arranged with being oppositely separated, and can contact each other; and an insulation member, which holds at least one detection electrode and has flexibility.

In accordance with the first aspect of the capacitance sensor, it can surely detect an object, which nears at least one detection electrode of the capacitance sensor provided at a movable part such as a power sliding door, by an electric potential change accompanying a capacitance change, and because also when the object directly contacts a sensor unit having the flexibility, the pair of the detection electrodes arranged with being separated is provided to be able to contact each other, and the electric potential change is detectable, the sensor can surely detect the object in non contact and contact.

A second aspect of a capacitance sensor is, in the first aspect of the sensor, that the one detection electrode is held so as to be able to contact the other detection electrode within closed space formed by the insulation member.

In accordance with the second aspect of the capacitance sensor, because the pair of detection electrodes is designed to be held within the closed space formed by the insulation member, it is easy that the one detection electrode deforms a hollow portion of the insulation member so as to be able to contact the other detection electrode and that space of the both electrodes can be configured as an insulation layer insulated with air, whereby simplification and weight saving of a structure of the sensor can be realized.

In a third aspect of a capacitance sensor, in any of the first and second aspects, the sensor comprises a shield electrode that surrounds the pair of detection electrodes and is arranged in advance in same electric potential as each of the detection electrodes.

In accordance with the third aspect of the capacitance sensor, because a difference between each capacitance of the pair of the electrodes in an object's nearing or contacting the electrodes is detected and determined, the shield electrode for surrounding the pair of the electrodes is provided, and thereby a disturbance influence of a droplet and the like is prevented, the sensor can easily obtain a structure that can more accurately realize erroneous detection prevention. In addition, the sensor can be suitably used for a difference detection capacitance sensor.

In a fourth aspect of a capacitance sensor one detection electrode held by the sensor unit is, in the third aspect of the sensor, provided at a position corresponding to an opening of the shield electrode.

In accordance with the fourth aspect of the capacitance sensor, because the one detection electrode held by the sensor unit is designed to be provided at the position corresponding to the opening of the shield electrode, directivity of electric flux lines for detection of a nearing object can be heightened. In addition, sensitivity of the one detection electrode becomes good, and a disturbance can be prevented as much as possible.

In a fifth aspect of a capacitance sensor, in any of the first to fourth aspects, a trim unit for being attached to a door and the like is provided, neighboring the sensor unit.

In accordance with the fifth aspect of the capacitance sensor an attachment structure of the sensor to a door and the like of a vehicle, where the trim unit (attachment unit) is provided, can be integrally formed, and an attachment work thereof can be simplified.

In a first aspect of a capacitance type object detection method, it is a method for detecting an object's nearing: when the object nears, a non-contact sensor detects it with non contact according to a change of a capacitance; and when the object makes contact, a contact sensor, which is deformed by the contact of the object, detects it with contact.

In accordance with the first aspect of the capacitance type object detection method, when the object nears to a limit and makes contact, the object can be surely detected by the contact sensor. Accordingly, when using such the object detection method for pinch detection, the pinch can be surely prevented.

In a second aspect of a capacitance type object detection method, in the first aspect of the capacitance type object detection method, the non-contact sensor and the contact sensor perform detection, using a capacitance sensor configured as an integrated sensor.

In accordance with the second aspect of the capacitance type object detection method, because an electrode structure and the like can be used for both by using the integrated sensor and performing detection, and the detection can be performed without using separate sensors, cost can be reduced in a total system. In addition, attachment space can be made small.

BRIEF DESCRIPTION OF THE DRAWINGS

FIG. 2A shows an electrode arrangement structure in non contact; FIG. 2B shows an electrode arrangement structure in contact.

FIG. 3 is a schematic drawing of a pinch prevention apparatus where a capacitance sensor of an embodiment of the present invention is built in.

FIG. 8A is a drawing showing an experiment result representing a change of a difference value in non contact when an object nears the capacitance sensor; FIG. 8B is a drawing showing an experiment result representing a change of a difference value when the object contacts the capacitance sensor

DESCRIPTION OF THE PREFERRED EMBODIMENTS

Here will be described an embodiment of the present invention in detail, referring to drawings as needed.

[General Outline]

Figure 1:
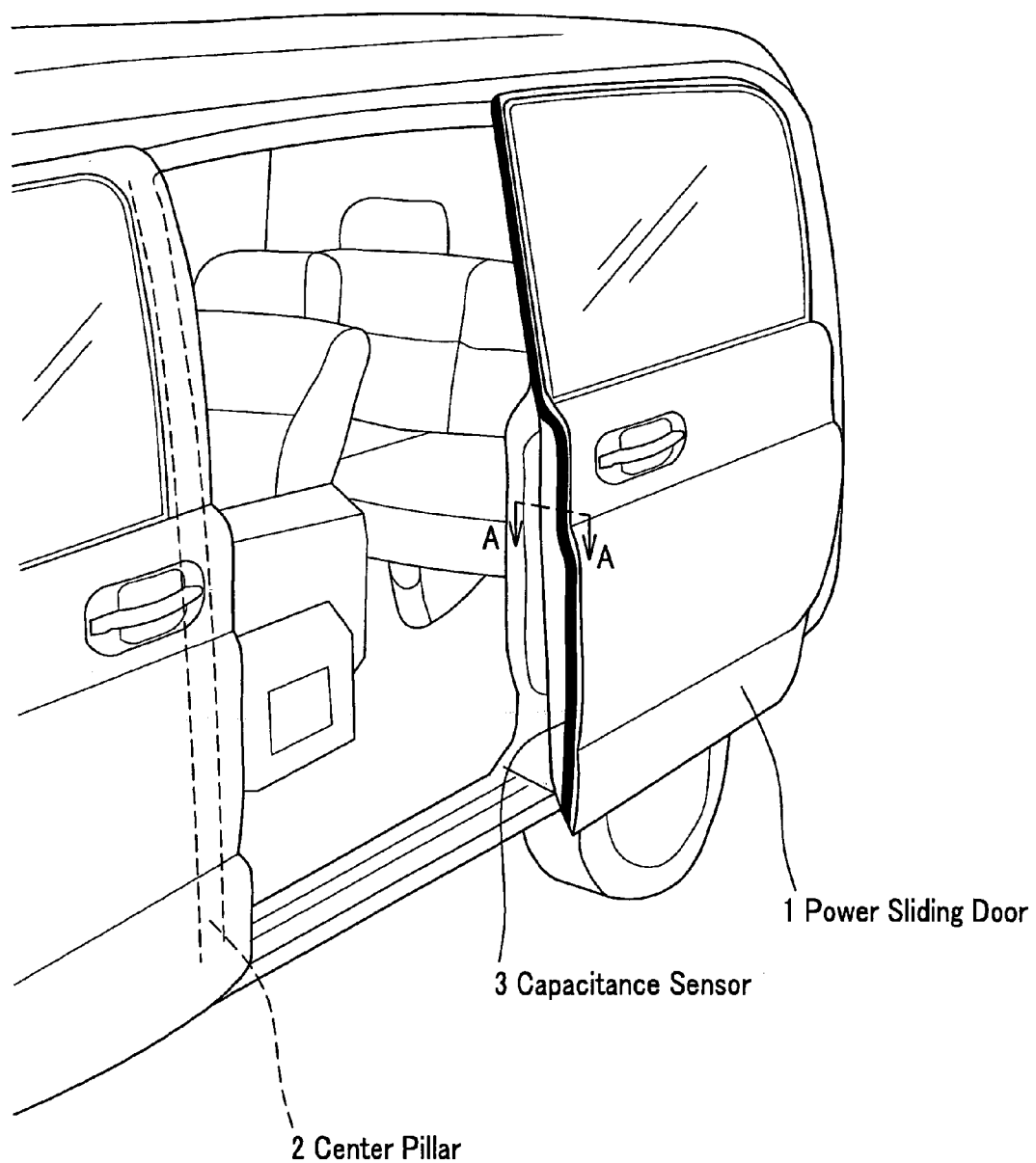
FIG. 1 is a perspective view showing a condition when a capacitance sensor of an embodiment of the present invention is applied to a pinch prevention apparatus of a power sliding door of an automobile.

In FIG. 1 is schematically shown a capacitance sensor 3 of the embodiment when applied to a pinch prevention apparatus, which will be described later, of a power sliding door 1 of an automobile adopting a power door system. In FIG. 1 the capacitance sensor 3 is extendedly provided to the power sliding door 1 provided at a side portion of the automobile along an end at a side of a close side facing a center pillar 2 of the power sliding door 1 that opens/closes.

[Capacitance Sensor]

Figure 2A:
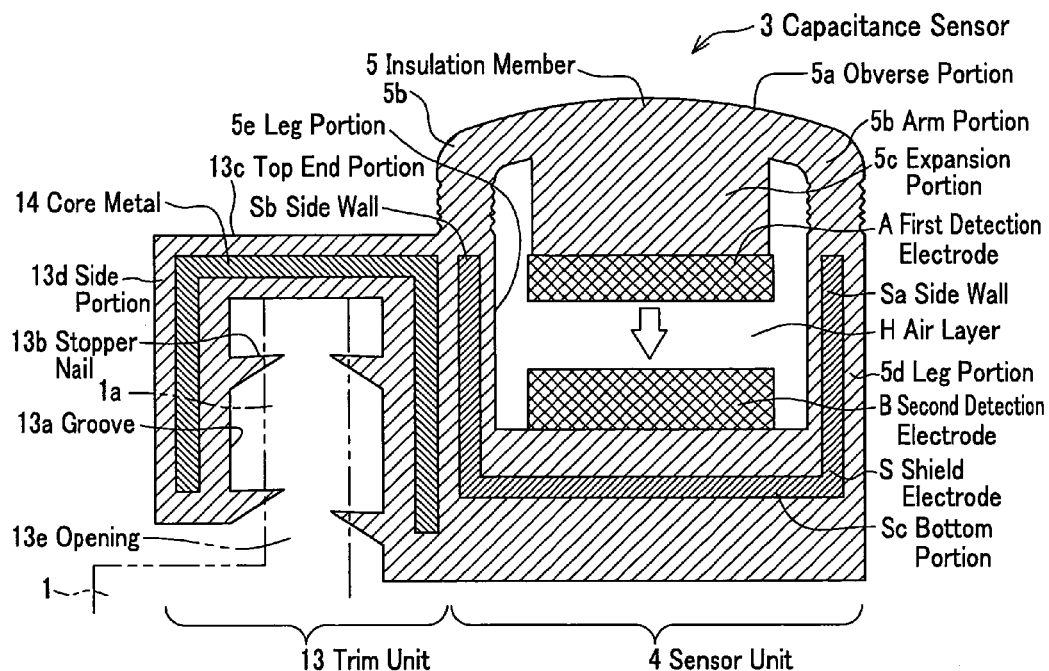
FIGS. 2A and 2B are section drawings taken along a line A—A in FIG. 1.

As shown in FIG. 1, the capacitance sensor 3 related to the embodiment is attached across an upper end and lower end of an end face of the power sliding door 1 facing the center pillar 2 of the automobile. As shown in FIG. 2A, the capacitance sensor 3 comprises a sensor unit 4 and a trim part 13 (attachment part) for being attached to the power sliding door 1. The sensor unit 4 is mainly configured of a first detection electrode A, a second electrode B arranged with being oppositely separated from the first detection electrode A, a shield electrode S for surrounding the first detection electrode A and the second electrode B, and an insulation member 5 for coating each of the electrodes A, B, and S.

The first detection electrode A, second detection electrode B, and shield electrode S are coated with the insulation member 5, which makes an external shape of the capacitance sensor 3, and are arranged so as to extend in a longitudinal direction of the insulation member 5. In other words, the first detection electrode A, second detection electrode B, and shield electrode S are designed to be arranged across the upper end and lower end of the end face of the power sliding door 1. Meanwhile, as an insulation material of the insulation member 5, for example, a rubber, an insulation resin, and the like can be cited.

As shown in FIG. 2A, the first detection electrode A is variably provided from a separation position to a contact one for the second detection electrode B. On the other hand, the second detection electrode B is fixedly provided within the insulation member 5. A variable structure of the first detection electrode A is designed to be realized by a structure of the first detection electrode A being provided at a reverse side of an obverse portion 5a of the insulation member 5 and arm portions 5b, 5b of the insulation member 5 being flexibly formed. In addition, the first detection electrode A and the second detection electrode B are configured as an integrated sensor by the insulation member 5. The first detection electrode A, the second detection electrode B, and the shield electrode S are formed of a strip-form conducting material of a constant width and length, and the electrode A is connected to a first reference capacitor CR1 (see FIG. 4) described later. And as described later, the first detection electrode A is designed so that constant electric potential is set when the first reference capacitor CR1 is charged. As a conducting material composing the first detection electrode A, for example, can be cited a conducting rubber, a conducting resin, and the like where a metal powder is contained in a metal or rubber as a filler.

The second detection electrode B is formed of a strip-form conducting material having a same width and length as the first detection electrode A. The second detection electrode B is connected to a second reference capacitor CR2 (see FIG. 4) described later, and as described later, is designed so that constant electric potential is set when the second reference capacitor CR2 is charged. Meanwhile, in the embodiment, when the first reference capacitor CR1 and the second reference capacitor CR2 are charged, the electric potential of the second detection electrode B is set to become equal to that of the first detection electrode A. As a conducting material composing the second detection electrode B, for example, can be cited a conducting rubber, a conducting resin, and the like where a metal powder is contained in a metal or rubber as a filler.

Although the first detection electrode A and the second detection electrode B show a structure of being arranged so as to overlap in a detection direction with keeping an opposite distance in an arrangement mode, the present invention is not limited thereto, and the structure may be displaced each other in a lateral direction of the electrodes A and B.

The shield electrode S is equal to the first detection electrode A and the second detection electrode B in length and is formed of a conducting material whose lateral section is substantially a square form without a left side. As described later, the shield electrode S is something for preventing a disturbance for the first detection electrode A and the second detection electrode B and is arranged so as to be coated at both sides and a lower side.

Figure 4:
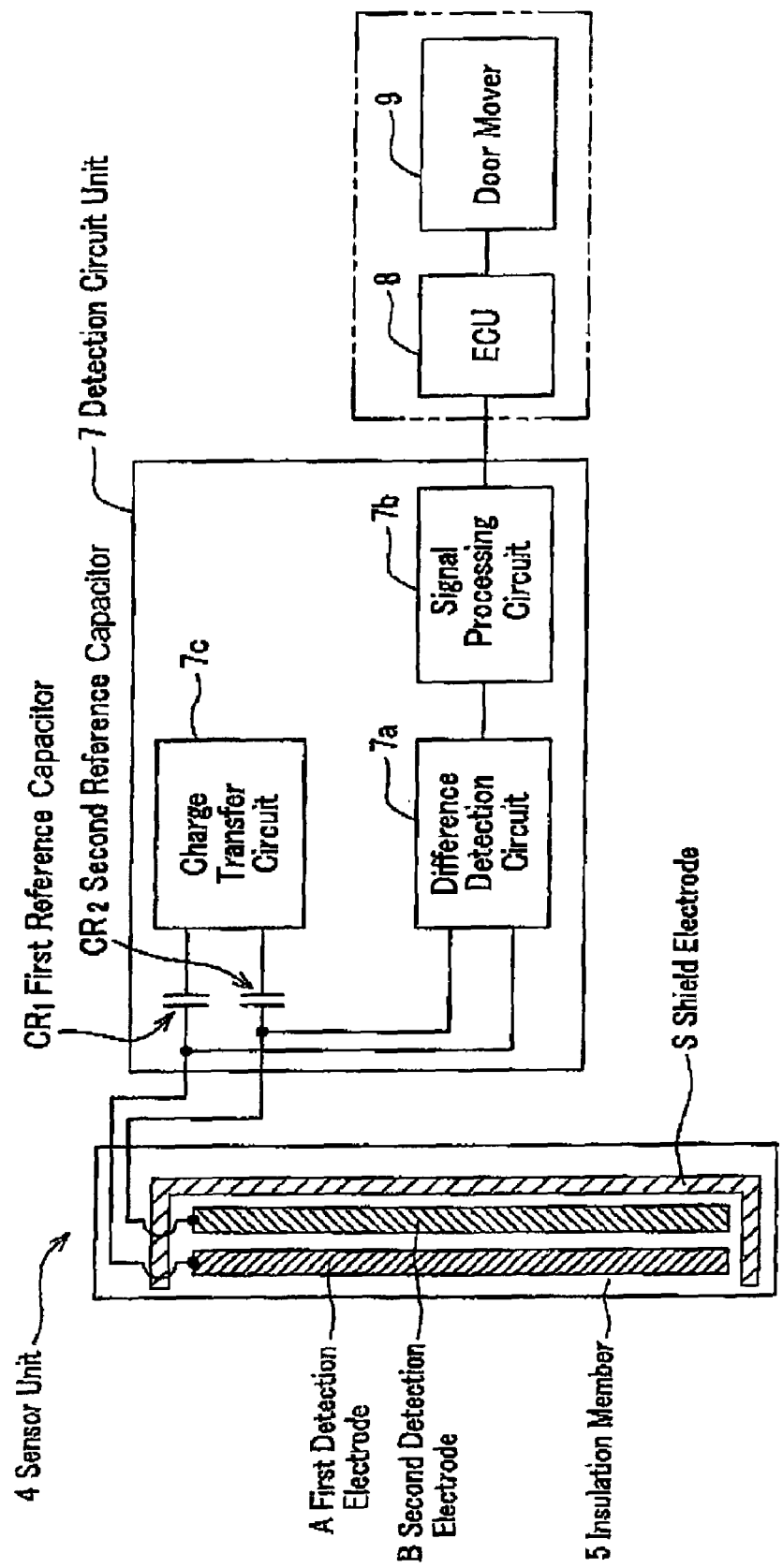
FIG. 4 is a block diagram of the pinch prevention apparatus of FIG. 3.

The shield electrode S is connected to act a following circuit so as to become common electric potential for the first detection electrode A and the second detection electrode B (see FIG. 4). As a conducting material composing the shield electrode S, for example, can be cited a conducting rubber, a conducting resin, and the like where a metal powder is contained in a metal or rubber as a filler.

The first detection electrode A, the second detection electrode B, and the shield electrode S are configured of respective electrodes whose polarity is all a same plus pole. The shield electrode S is arranged so as to surround other three directions except for an obverse side that becomes the detection direction of the first detection electrode A, and a bottom portion Sc of the shield electrode S is arranged in parallel to the first detection electrode A and the second detection electrode B. Meanwhile, in the embodiment, although the polarity of the first detection electrode A and the second detection electrode B is described as plus, the present invention is not limited thereto, and one of the electrodes may be made minus.

As shown in FIG. 2A, the insulation member 5 is formed of a structure of the sensor unit 4 and the trim unit 13 being integrally connected. A portion of the sensor unit 4 in the insulation member 5 is formed like a hollow body having space inside. In the space an insulator layer is formed, and an air layer H with an insulation property is formed in the embodiment. An expansion portion 5c where the first detection electrode A is arranged is provided inside the insulation member 5 corresponding to the obverse portion 5a. The second detection electrode B is arranged with being oppositely separated from the first detection electrode A on a bottom face of the insulation member 5 opposite to the expansion portion 5c. It is embedded the shield electrode S whose section is a square form without one side opening upward across from the bottom face to leg portions 5d, 5e of the insulation member 5.

Figure 2B:
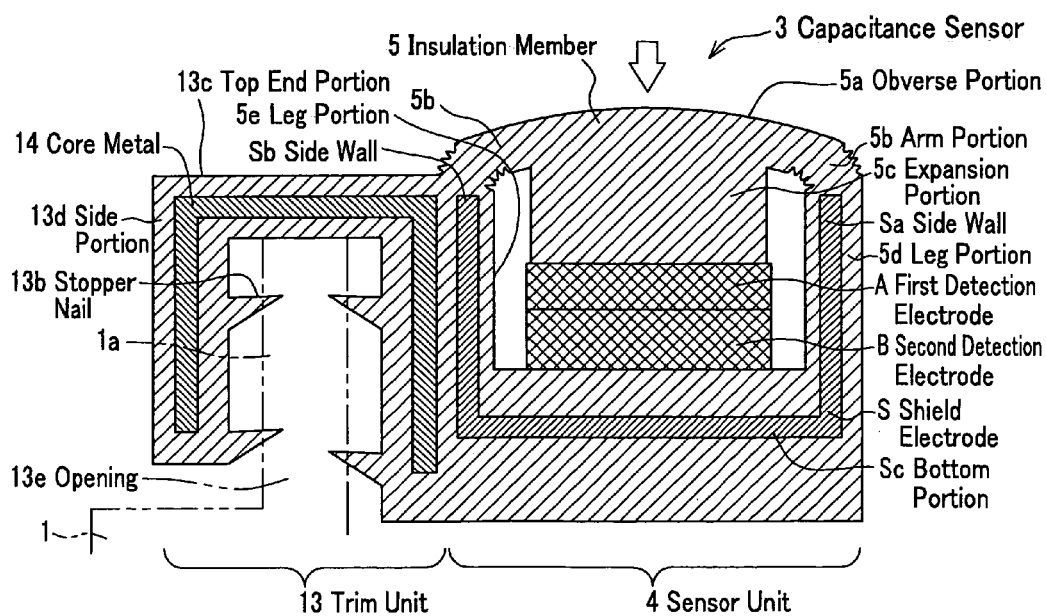

In the insulation member 5 are flexibly provided arm portions 5b, 5b for communicating both sides of the expansion portion 5c with upper portions of side walls Sa, Sb of the shield electrode S. Nothing but the air layer H intervenes between the first detection electrode A and the second detection electrode B arranged inside the insulation member 5. Therefore, if an object contacts the insulation member 5 and external force acts, the member 5 is, as shown in FIGS. 2B, designed so that the arm portions 5b, 5b flex and the first detection electrode A and the second detection electrode B can be directly contacted.

Neighboring the sensor unit 4, the trim unit 13 is integrally provided with the sensor unit 4, which trim unit 13 is formed attachable to an edge portion 1a at a close side of the power sliding door 1. In the trim unit 13 is provided groove 13a opening in an opposite direction for the detection direction of the first detection electrode A. The groove 13a is formed to be attached to the edge portion 1a of the power sliding door 1. On opposite groove faces within the groove 13a are provided lip-form stopper nails 13b for pull-out prevention. In the trim unit 13, as a reinforcement member is embedded a core metal 14 whose section is a U-shape. One leg of the core metal 14 and the side wall Sb of the shield electrode S are separated and embedded in the leg portion 5e of the insulation member 5. Meanwhile, instead of the core metal 14, the shield electrode S may be provided; and in addition, extending the shield electrode S and integrating it with the core metal portion, the shield electrode S may be formed.

The first detection electrode A, the second detection electrode B, and the shield electrode S provided in the sensor unit 4 shown in FIG. 2A are connected to a detection circuit unit 7 (see FIG. 4) described later. The first detection electrode A and the second detection electrode B are something for forming capacitances between an object 6's (see FIG. 5) nearing the power sliding door 1 (see FIG. 1) and themselves and are coated with the insulation member 5 whose outer surface has retractility. The insulation member 5 is preferable to be formed of a resin such as a rubber and a chemical fiber that have any of the retractility and flexibility.

The shield electrode S surrounds three directions except for a detection direction (extension direction of an opening of the shield electrode S) of the pair of the first detection electrode A and the second detection electrode B and is arranged in advance to become a same electric potential as they are. Accordingly, in a detection non-operation of a condition of not detecting the object 6 there occurs no electric potential between the first detection electrode A, the second detection electrode B, and the shield electrode S. In addition, space between the first detection electrode A, the second detection electrode B, and the shield electrode S is insulated by the insulation member 5.

[Pinch Prevention Apparatus]

Figure 3:
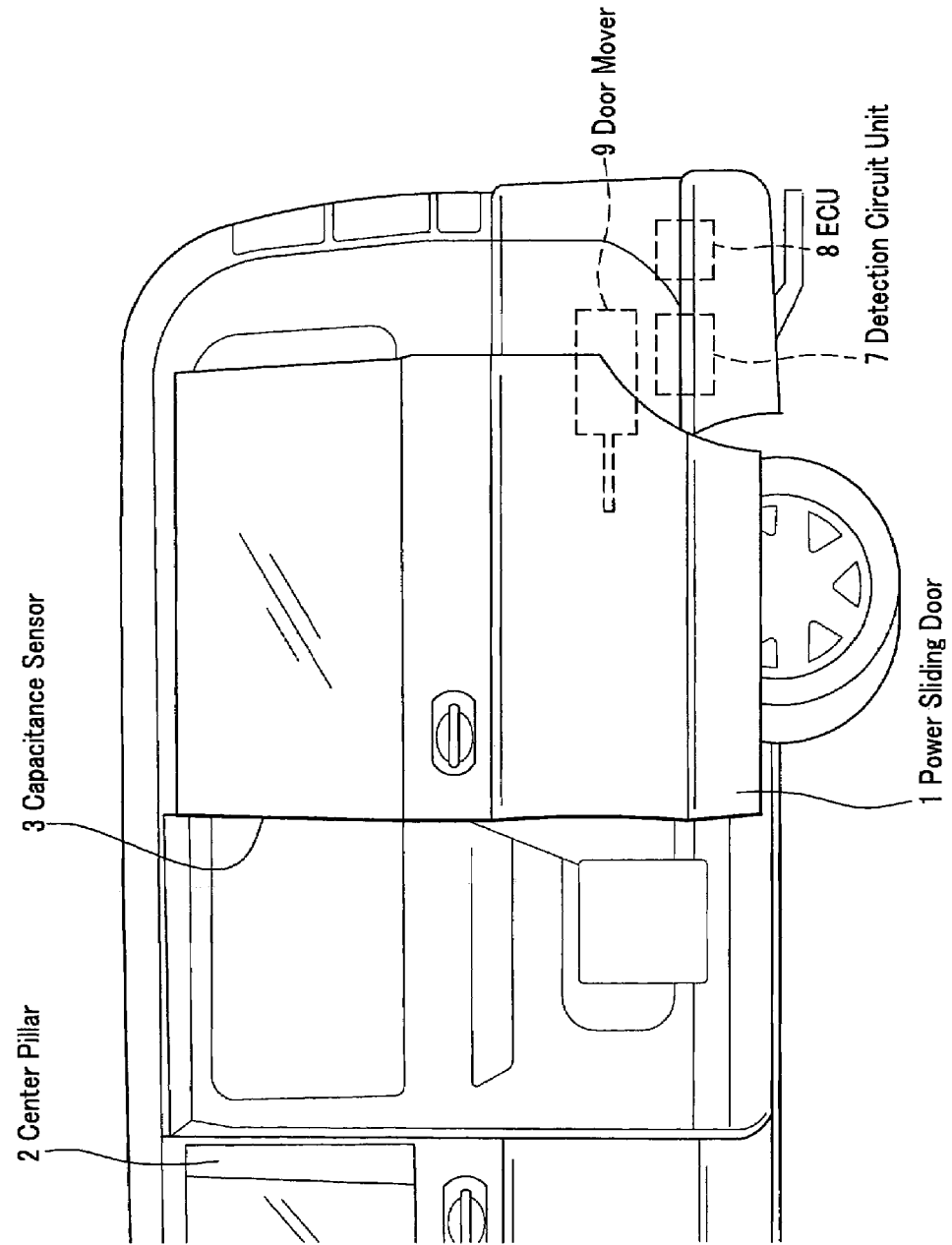

In FIG. 3 is shown a pinch prevention apparatus where the capacitance sensor 3 of the present invention is applied. The pinch prevention apparatus comprises the capacitance sensor 3, a door mover 9, an ECU (Electronic Control Unit) 8, and the detection circuit unit 7. The door mover 9, the ECU 8, and the detection circuit unit 7 are arranged at a vehicle body side of an automobile.

The door mover 9 has a known structure of opening/closing the power sliding door 1 through an instruction signal output by the ECU 8 and is configured of an electric motor (not shown), which rotates normally/reversely or stops in response to the instruction signal output by the ECU 8, and a push-pull mechanism (not shown) such as a caterpillar, which receives rotation force of the electric motor and pushes/pulls the power sliding door 1.

As shown in FIG. 4, the detection circuit unit 7 comprises the first reference capacitor CR1, the second reference capacitor CR2, a charge transfer circuit 7c, a difference detection circuit 7a, and a signal processing circuit 7b. The first reference capacitor CR1 is connected to the first detection electrode A of the capacitance sensor 3; and the second reference capacitor CR2 is similarly connected to the second detection electrode B. In addition, when power supply is started by a switch operation, the first reference capacitor CR1 and the second reference capacitor CR2 are designed to be charged by the charge transfer circuit 7c and to accumulate reference electric charge. Meanwhile, although the first reference capacitor CR1 and the second reference capacitor CR2 may be capacitors of a same capacitance, they may be capacitors of a different capacitance as needed.

The reference capacitors CR1 and CR2 in the embodiment are provided at the detection circuit unit 7 in order to detect and compare respective capacitance changes of the respective capacitors occurring between the object 6 and each of the first detection electrode A and the second detection electrode B and make the changes a reference when checking electric potential between the electrodes A and B.

The charge transfer circuit 7c is designed to be activated in an ON condition of a door open/close switch (not shown) of the power sliding door 1 being operated and to charge the first reference capacitor CR1 and the second reference capacitor CR2 with the electric charge. In addition, in a complete-close condition of the power sliding door 1 the charge transfer circuit 7c is designed to discharge the electric charge charged with the first reference capacitor CR1 and the second reference capacitor CR2. As the charge transfer circuit 7c can be adopted one of a known configuration. The door open/close switch is provided on an inner wall of a driver's seat door, those of other doors, and the like.

The difference detection circuit 7a is connected to the first detection electrode A and the second detection electrode B and is designed to detect electric potential set for them when the electric charge is charged in the first reference capacitor CR1 and the second reference capacitor CR2 and to detect a difference value between the electric potential of the electrode A and that of the electrode B. And the difference detection circuit 7a is designed to output the detected difference value to the signal processing circuit 7b described next. As the difference detection circuit 7a can be used, for example, a known differential amplifier circuit.

The signal processing circuit 7b is designed to input a difference detection signal from the difference detection circuit 7a to itself and to compare a difference value based on the difference detection signal with a difference threshold set in advance. And the signal processing circuit 7b is designed to compare the difference value based on the difference detection signal with any threshold in non-contact or contact and to determine detection of the object 6 such as a human body.

Figure 8A:
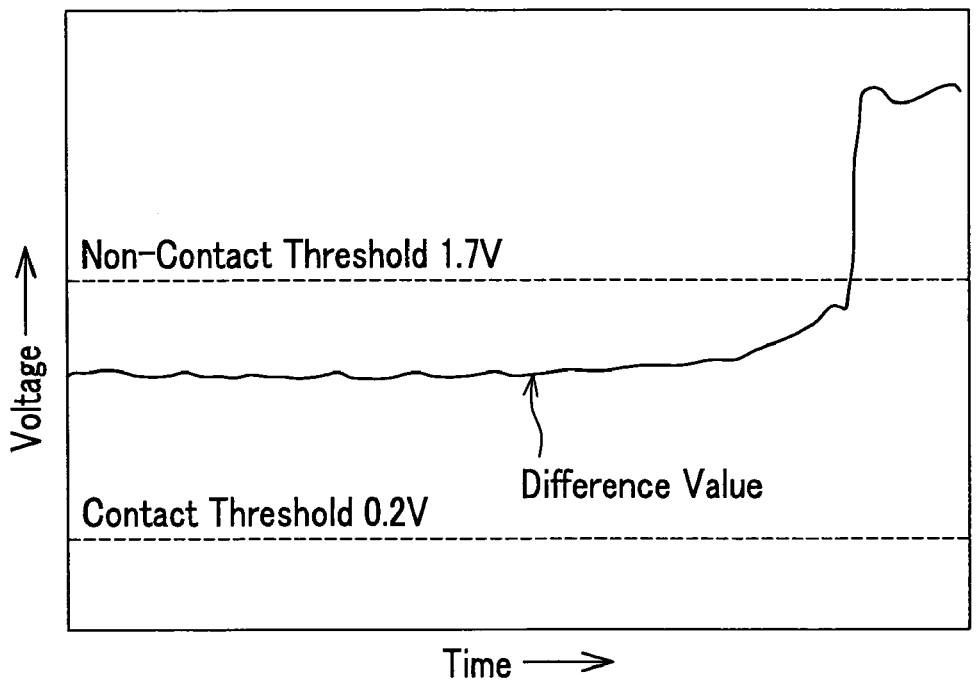
FIGS. 8A and 8B are drawings showing experiment results showing changes of difference values according to a capacitance sensor.
Figure 8B:
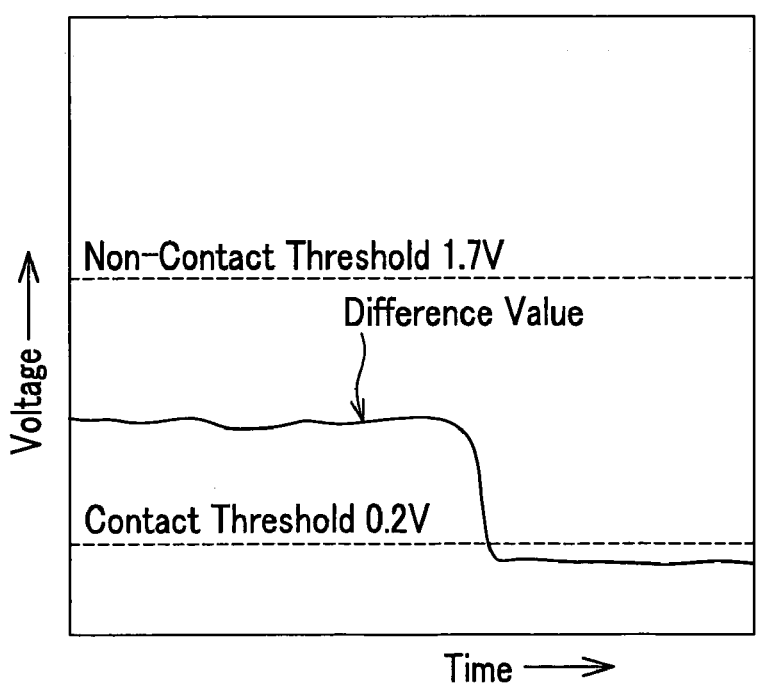
Figure 9A:
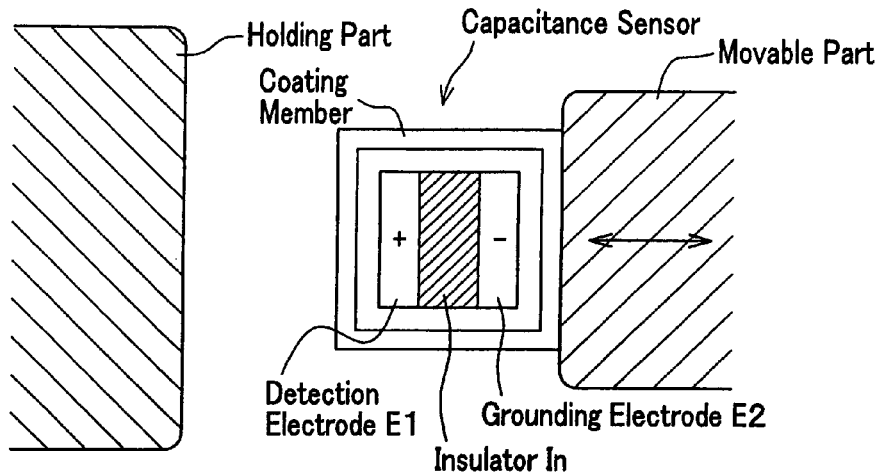
FIGS. 9A, 9B, and 9C are illustration drawings of a conventional capacitance sensor.
Figure 9B:
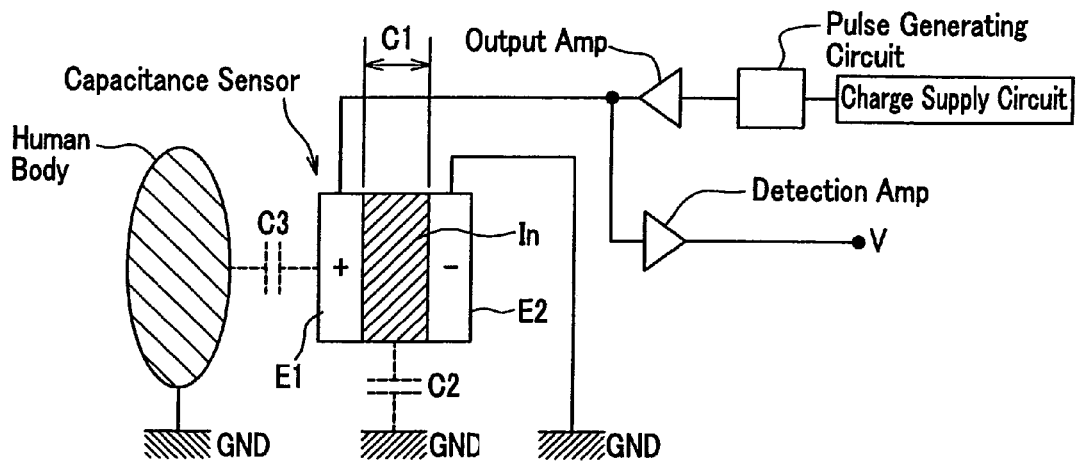
Figure 9C:
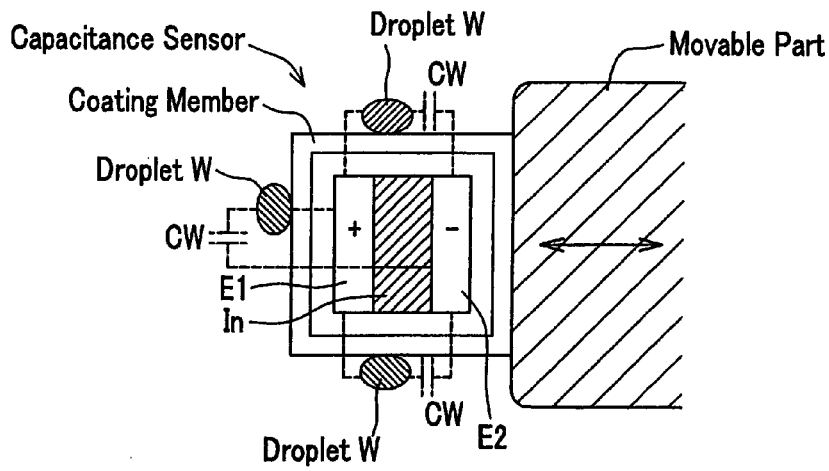

FIGS. 8A and 8B are schematic drawings showing experiment data of non-contact detection and contact detection. In FIG. 8A, although if the object 6 is located at a sufficiently remote distance from the capacitance sensor 3, a difference value, which is output based on a difference detection signal in non contact, transits in time lapse at a change of an extent of difference value 1 (V) lower than set non-contact threshold 1.7 (V), for example, when the non-contact threshold is set 1.7 (V) in electric potential; and if the object 6 nears the capacitance sensor 3, the output of the difference value drastically augments and the difference value rises. And if it exceeds the set non-contact threshold 1.7 (V), the signal processing circuit 7b shown in FIG. 4 outputs a detection signal of the object 6 to the ECU 8.

On the other hand, in FIG. 8B, if the object 6 directly contacts the capacitance sensor 3, and accordingly, the first detection electrode A moves in position and contacts the second detection electrode B, for example, when a contact threshold is set 0.2 (V) in electric potential, the output of the difference value, which transits in time lapse at the change of the extent of the difference value 1 (V), drastically lowers. And if the set contact threshold becomes lower than the set contact threshold 0.2 (V), the signal processing circuit 7b outputs a detection signal of the object 6 to the ECU 8.

Thus the signal processing circuit 7b is designed to output the detection signal to the ECU 8 if determining the detection of the object 6. As the signal processing circuit 7b can be cited one configured with a CPU (Central Processing Unit) that compares a memory, where a threshold is stored, with the threshold, referring to the memory with the difference value based on the difference detection signal, and outputs the object detection signal to the ECU 8 when the difference value is within a range of the threshold set so as to determine the detection of the object 6.

[Operation of Capacitance Sensor]

Figure 5:
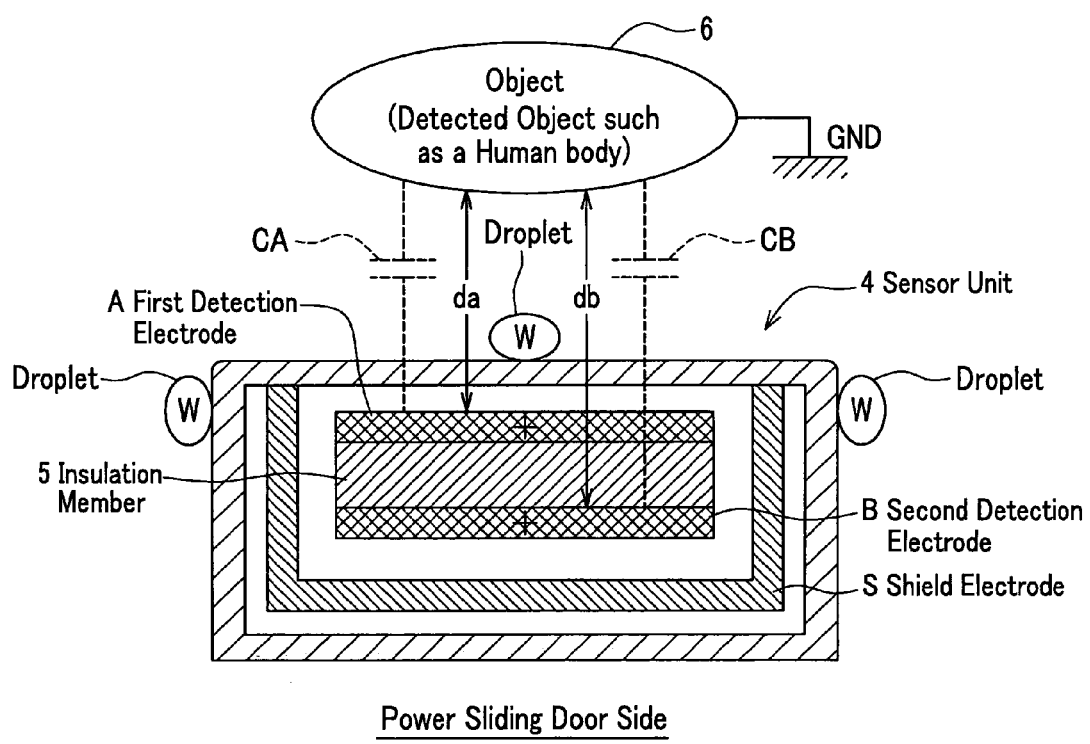
FIG. 5 is a schematic drawing illustrating an operation of an capacitance sensor of an embodiment of the present invention.

Next will be described an operation of the capacitance sensor 3, referring to FIGS. 4 and 5. In FIG. 5, for a description, nothing but the sensor unit 4 is schematically shown, omitting the trim unit 13. A pair of the first detection electrode A and the second detection electrode B is arranged with each electrode of plus polarity. Static capacitors CA, CB are formed between the conducting object 6 such as a human body and each of the electrodes A and B. The electrodes A and B are separated each other at a constant distance (t) within the insulation member 5 through another insulator such as air and are arranged in a condition of being surrounded by the shield electrode S. Meanwhile, although an arrangement relationship of the electrodes A and B is such that they overlap each other in a detection direction as shown in FIG. 5, they may be displaced and provided so as not to overlap in the detection direction.

As shown in FIG. 5, the static capacitor CA is formed with a distance da between the object 6 and the first detection electrode A. In addition, the static capacitor CB is formed with a distance db between the object 6 and the second detection electrode B. The sensor unit 4 sends respective capacitances to the difference detection circuit 7a shown in FIG. 4, and the circuit 7a is designed to output a difference value, which is converted to electric potential corresponding to the capacitances detected.

As shown in FIG. 5, for example, because if due to rain and the like a droplet adheres to a surface and periphery of the insulation member 5 for coating the first detection electrode A, the second detection electrode B, and the shield electrode S, side faces of the electrodes A and B are covered with the shield electrode S, an influence on the electrodes A and B results in becoming a small value. For example, because if a surface area of the first detection electrode A augments in an appearance, and a change of a capacitance has actually occurred, each of the electrodes is designed to be same electric potential, the change is not output as an electric signal. Accordingly, even if a droplet adheres to a surface of the sensor unit 4, malfunction detection of the pinch prevention apparatus is prevented from occurring. In addition, by the shield electrode S, it is reduced a noise that occurs according to fluctuations of the capacitance due to those of an external environment (some external environment such as temperature, humidity, and vibration). Accordingly, it augments a ratio (S/N ratio) of a signal for a noise that occurs due to the fluctuations of the external environment, and thus stable detection sensitivity of the sensor unit 4 can be maintained. Therefore, it is enabled to set a threshold of the detection circuit unit 7 small, and detection regions of the first detection electrode A and the second detection electrode B can be enlarged.

Both shield side walls Sa, Sb (see FIGS. 2A and 2B) of the shield electrode S function as a directional control mechanism for limiting directivity of electric flux lines of the first detection electrode A and the second detection electrode B. The both shield side walls Sa, Sb are integrally formed with the bottom portion Sc. Therefore, the electric flux lines extending from surfaces of the electrodes A and B result in extending in nothing but a direction not shielded by the both shield side walls Sa, Sb. Accordingly, a direction of the electric flux lines of the electrodes A and B, that is, the directivity can be controlled by providing the shield walls Sa, Sb.

[Detection Method of Detection Circuit]

Here will be described a detection operation of the detection circuit unit 7 where the sensor unit 4 is connected, referring to FIG. 4. The detection circuit unit 7 shown in FIG. 4 comprises the difference detection circuit 7a and is electrically connected to the first detection electrode A and the second detection electrode B. Each connection circuit between the difference detection circuit 7a and each of the electrodes A and B is branched within the detection circuit unit 7 and is separately connected to the reference capacitors CR1, CR2. In the difference detection circuit 7a a difference occurs in respective capacitance values that stay in the static capacitors CA, CB at the distances da, db (see FIG. 5) between the object 6 and each of the first detection electrode A and the second detection electrode B, wherein the electrodes A and B have the constant distance t. The difference detection circuit 7a is designed to detect electric potential corresponding to a difference of the capacitance values.

[Detection Method of Difference Value]

In a difference detection method of a difference value in accordance with the capacitance sensor 3 of the present invention, accompanying nearing of the object 6 such as a human body, there occurs a difference of capacitance values generated between the object 6 and each of the first detection electrode A and the second detection electrode B due to a difference of the distances da, db of the electrodes A and B; and a difference detection method of a difference value by the capacitance sensor 3 is a method for converting the difference of the capacitance values to a corresponding difference value of electric potential, outputting it to the signal processing circuit 7b, comparing it with a threshold, and determining detection of any of nearing and contact of the object 6.

In other words, as shown in FIG. 1, assuming a condition of the object 6 such as a human body existing between the power sliding door 1 and the center pillar 2, a capacitor is formed between the first detection electrode A and the object 6 as shown in FIG. 5. From a relationship between a composite value C of a capacitance consisting of the capacitance (C1+C2+C3) of the formula (2) accumulated in the capacitor and the electric potential V and electric charge Q of the first detection electrode A, a following formula consists:

$$V = Q/C. \tag{3}$$

Here a difference of capacitance values of the first detection electrode A and the second detection electrode B is expressed in a following formula:

$$CA(=\epsilon \times SA/da) > CB(=\epsilon \times SB/db), \tag{4}$$

where CA and CB are respective capacitances of the first detection electrode A and the second detection electrode B, $\epsilon$ is permittivity of a substance including air existing between the sensor unit 4 and the object 6, SA and SB are respective areas of portions of the electrodes A and B assumed to be opposite to the object 6, and da and db are distances between the object 6 and the respective electrodes A and B.

As known from the formulas (3) and (4), because the capacitance C1 of the first detection electrode A and second detection electrode B of the sensor unit 4 itself and the capacitance C2 between the sensor unit 4 and the ground can be assumed constant, a change of the electric potential may be assumed to be due to the capacitance C3 between the sensor unit 4 and the object 6 and to occur due to any of the object 6's such as a human body existing at and nearing a periphery of the sensor unit 4, which perform detection. Thus it turns out that if the object 6 such as a human body nears, the electric potential V lowers. Accordingly, a fundamental principle of the detection method of the capacitance sensor 3 is a method for converting a change of a capacitance due to any of the object 6's such as a human body existing at and nearing the electric potential V to electric potential and detecting it. Thus because the composite value C of capacitances augments due to the nearing of the object 6 such as a human body, non-contact detection is enabled.

From the formulas (3) and (4), the difference value is obtained by a difference between electric potential VA and electric potential VB of the first detection electrode A and the second detection electrode B, that is, VA−VB. Because the more the object 6 nears the more largely a difference between the distances da, db is influenced, the difference value VA−VB augments.

The electric potential difference is detected and used for detection determination and is converted to the difference value (electric potential difference value) by the difference detection circuit 7a.

The difference value detected by the difference detection circuit 7a is output to the signal processing circuit 7b. The difference value output to the signal processing circuit 7b is compared to two thresholds set by the signal processing circuit 7b in advance, that is, a non-contact threshold and a contact threshold. The two thresholds in the signal processing circuit 7b are set according to a threshold in non contact, for example, threshold 1.7 (V) set from a peak value when the object 6 such as a human body nears the first detection electrode A and the second detection electrode B; and a threshold in contact, for example, threshold 0.2 (V) when the object 6 directly contacts one electrode, for example, the first detection electrode A.

[Operation of Pinch Prevention Apparatus]

Next will be described a pinch prevention apparatus where the capacitance sensor 3 of the embodiment is applied, referring to FIGS. 1 to 4. As shown in FIG. 1, operate a door open/close switch (not shown) of the power sliding door 1, and move the door to a storage position of an open condition. In the open condition, if operating the door open/close switch toward a close side of the power sliding door 1, the door 1 located at the storage position start a close progression. By the switch operation, the ECU 8 starts power supply so that an electric motor (not shown) provided at the door mover 9 normally rotates. Simultaneously, an encoder (not shown) detects that the electric motor normally rotates and sends a detection signal thereof to the ECU 8. Simultaneously, the ECU 8 starts the power supply to the detection circuit unit 7. Although not shown, to the ECU 8 are connected the detection circuit unit 7 and the encoder coupled with a drive shaft of the electric motor of the power sliding door 1.

Firstly, non-contact detection will be described. When the power sliding door 1 is being closed by normal rotation drive of the electric motor, output increases that is formed of a composite value of capacitances between the object 6 such as a human body and each of the first detection electrode A and the second detection electrode B as the object 6 nears the electrodes A and B extendedly provided at an end of the power sliding door 1. And as shown in FIG. 8A, when the object 6 nears till just before the electrodes A and B, output of the detection circuit unit 7 drastically augments due to the electrodes A and B. The output is detected by the difference detection circuit 7a of the detection circuit unit 7, and the detected signal is sent to the signal processing circuit 7b. If an amplitude of the sent electric signal exceeds a threshold in non contact, for example, the threshold 1.7 (V), the signal processing circuit 7b outputs a signal to the ECU 8. If the ECU 8 inputs the signal, it determines detection of an abnormal condition occurrence and issues a stop command for stopping an operation of the door mover 9. In addition, at the same time the ECU 8 issues a reverse rotation command for moving the door mover 9 in an opening direction.

Meanwhile, because although the detection circuit unit 7 itself has a moving object detection circuit, the first detection electrode A and the second detection electrode B move together with a close operation of the power sliding door 1, the unit 7 can also detect a stationary object existing within a detection region other than the moving object 6's such as a human body nearing the detection region.

If a stop command is issued to the door mover 9 from the ECU 8, it checks the motor normal/reverse rotation detection signal, and then the door mover 9 instantly stops the electric motor. Furthermore, the door mover 9 reverses the polarity of the electric motor and reverses the power sliding door 1. Therefore, the pinch prevention apparatus can prevent the power sliding door 1 from pinching the object 6 therein. The embodiment adjusts a detection region, where a set threshold in non contact is reached, in a range of about 5 mm to an extent of 50 mm.

Next will be described direct contact detection. If the object 6 such as a human body directly contacts the sensor unit 4 of the power sliding door 1 while the power sliding door 1 is closed, in other words, if the object 6 directly contacts, as shown in FIG. 2A, the obverse portion 5a of the insulation member 5 of the sensor unit 4, the arm portions 5b, 5b of the insulation member 5 flex as shown in FIG. 2B, and thereby the first detection electrode A moves and contacts the second detection electrode B. If so, as shown in FIG. 8B, the first detection electrode A and the second detection electrode B become same in electric potential, and a difference value according to difference capacitances formed between the object 6 and each of the electrodes A and B drastically decreases nearly to zero, in other words, not more than a threshold in contact set the threshold 0.2 (V). If so, the ECU 8 determines that an abnormal condition occurs, then issues a stop command to the door mover 9, instantly reverses the polarity of the electric motor, and thus reverses the power sliding door 1. Therefore, the pinch prevention apparatus can prevent the power sliding door 1 from pinching the object 6 therein.

In detection processing thus described, if the signal processing circuit 7b once sends a detection signal to the ECU 8, the circuit 7b ignores a new detection signal subsequently sent from the difference detection circuit 7a until the electric motor is reversed and stops. In addition, during this time a close operation of the door open/close switch is ignored by the ECU 8 if any. The reverse of the electric motor is detected by the encoder not shown, and a detection signal thereof is sent to the ECU 8. If the power sliding door 1 finishes opening till a storage position, the ECU 8 stops the power supply to the electric motor.

At the same time of the electric motor stopping, the signal processing circuit 7b becomes to be able to receive a detection signal sent from the difference detection circuit 7a and to further perform the close operation of the door open/close switch. In other words, the signal processing circuit 7b returns to an original condition. Accordingly, if the close operation of the door open/close switch is again performed, the stopped electric motor starts normal rotation. And if the power sliding door 1 again starts closing, and the ECU 8 detects that the power sliding door 1 reaches the close position, the ECU 8 stops the power supply of the electric motor.

In addition, if the ECU 8 detects an abnormal condition, it can be configured so as to send an actuation signal to a warning mechanism not shown. In this case, for example, by receiving the actuation signal, the warning mechanism announces by an electronic voice through a speaker thereof that the pinch prevention apparatus is actuated. After the announcement by the electronic voice is repeated predetermined times, it stops.

[Flowchart]

Figure 6:
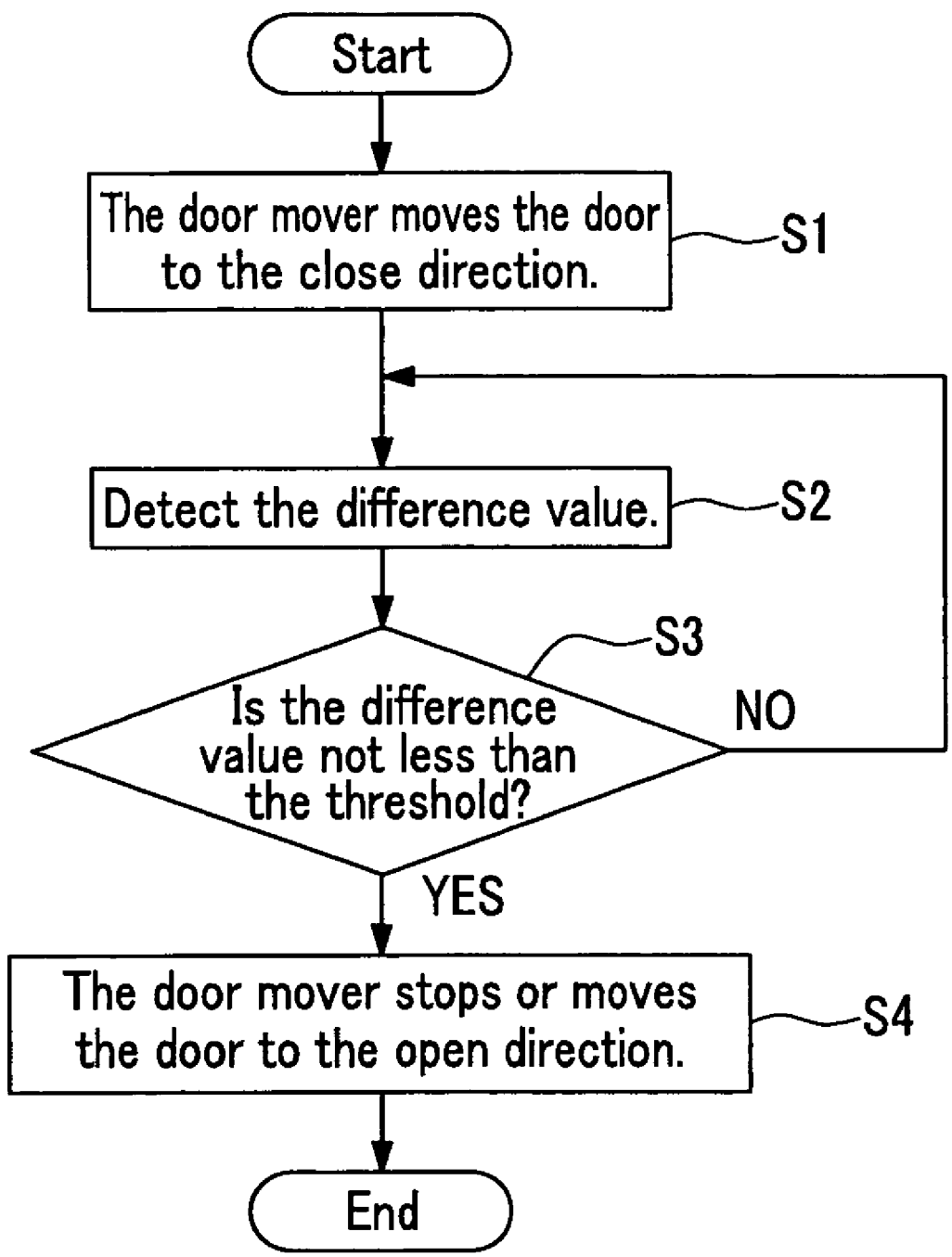
FIG. 6 is a flowchart showing control flow of a pinch prevention apparatus of a non-contact capacitance sensor.

Next will be described an outline of control flow of a pinch prevention apparatus of the embodiment, referring to FIGS. 6 and 7. A flowchart shown in FIG. 6 is a description drawing showing an outline of control flow of a non-contact pinch prevention apparatus. At time of a start, if power is supplied to the pinch prevention apparatus, the first reference capacitor CR1 and the second reference capacitor CR2 are charged, and thus a reference amount of electric charge is accumulated.

Firstly, in a step S1 the ECU 8 determines whether or not the power sliding door 1 is in a moving condition of a close direction according to whether or not an electric motor is driven in a normal rotation direction. As a result of the step S1, if the ECU 8 determines that the electric motor is not driven in the normal rotation direction, it ends the flow of one cycle. On the other hand, if it determines that the electric motor is driven in the normal rotation direction, it advances to processing flow of a step S2.

In the step S2 the ECU 8 determines whether or not there occurs a difference value of electric potential between the first detection electrode A and the second detection electrode B corresponding to capacitances from the electrodes A and B of the capacitance sensor 3. If the ECU 8 determines that there occurs no difference value of electric potential between the electrodes A and B, it returns the processing flow to the step S1 and repeats the processing after the step S1. If the ECU 8 determines that there occurs the difference value of the electric potential between the electrodes A and B, it advances to processing flow of a step S3.

In the step S3 the signal processing circuit 7b compares an output difference value with a threshold set in advance, based on the difference value output from the difference detection circuit 7a corresponding to a capacitance of the capacitance sensor 3 and thereby determines whether or not there occurs a fear of pinching the object 6 such as a human body due to its nearing, that is, presence or absence of pinch. As a result of comparison between the difference value and the set threshold, if the output difference value is not more than the threshold, and the ECU 8 determines that there occurs no fear of the object 6's being pinched, it returns the processing flow to the step S2 and repeats the processing after the step S2. On the other hand, if the output difference value exceeds the set threshold, the ECU 8 determines that there occurs the fear of the object 6's being pinched, it advances to processing flow of a step S4.

In the step S4 the ECU 8 issues a command of stopping/reversing the drive of the electric motor of the door mover 9 and thereby instantly stops the motor. At the same time the ECU 8 reversely changes the polarity of the electric motor and thus reverses the drive direction of the power sliding door 1 in the open direction. And if the power sliding door 1 returns to the open position, the ECU 8 stops the drive of the electric motor. Thus the ECU 8 ends the processing of one cycle.

In the step S4, by comparing the difference value and the threshold set in advance, the ECU 8 determines the presence or absence of the fear of the object 6's being pinched due to its nearing the capacitance sensor 3 at the end of the power sliding door 1 and thereby determines the fear of the object 6 pinch. If the ECU 8 determines the fear of the object 6 pinch, it is designed to instantly stop the close progression of the power sliding door 1 and to reverse it by issuing the command of changing the driven direction of the electric motor. Thus the pinch of the object 6 such as a human body between the center pillar 2 and the power sliding door 1 can be quickly prevented at non contact timing.

In each of the steps of the control flow, if the ECU 8 does not detect abnormality, the power sliding door 1 continues on driving by the electric motor and completes closing. If the closing of the power sliding door 1 completes, power supply is shut off, the electric charge, which is charged into the first reference capacitor CR1 and the second reference capacitor CR2, is discharged.

Figure 7:
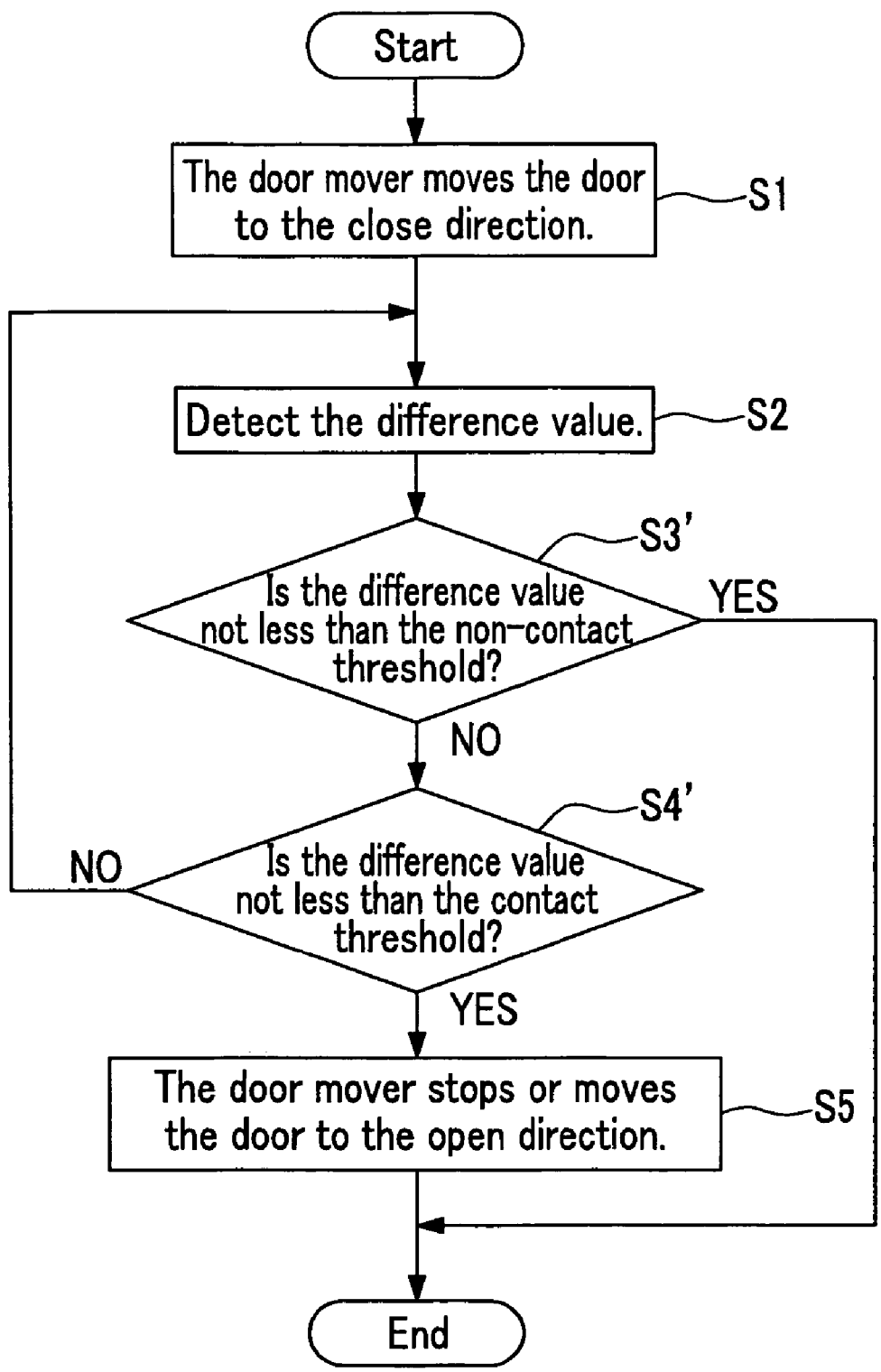
FIG. 7 is a flowchart showing control flow of a pinch prevention of a contact/non-contact capacitance sensor.

A flowchart shown in FIG. 7 is a description drawing showing an idea of control flow of a non-contact/contact pinch prevention apparatus. A difference of the control flow from that of the non-contact pinch prevention apparatus shown in FIG. 6 is that in addition to the non-contact detection in the object 6's such as a human body nearing the capacitance sensor 3, the former control flow is enabled to also perform contact detection in the object 6's directly contacting the capacitance sensor 3. In the control flow the description till the step 2 will be omitted because it is same as that of FIG. 6.

In a step S3' the signal processing circuit 7b determines a difference value output from the difference detection circuit 7a, comparing it with a set threshold of the non-contact detection. If the output difference value from the difference detection circuit 7a is not more than the threshold of the non-contact detection, and the signal processing circuit 7b determines that there occurs no pinch of the object 6 such as a human body, it advances the processing flow to a step S4'. On the other hand, if the output difference value exceeds the threshold of the non-contact detection, and the signal processing circuit 7b determines that there occurs nearing of the object 6, the ECU 8 advances to the processing of a step S5.

In the step 4 the signal processing circuit 7b determines the difference value output from the difference detection circuit 7a, comparing it with a set threshold of the contact detection. If the difference value output from the difference detection circuit 7a exceeds the threshold of the contact detection, and the signal processing circuit 7b determines that there occurs no contact of the object 6 such as a human body, it returns the processing flow to the step S2 and repeats the processing after the step S2. On the other hand, if the output difference value is not more than the threshold of the contact detection, and the signal processing circuit 7b determines that there occurs contact of the object 6, it advances to the processing of a step S5.

In the step S5, same as in the operation of the control flow of FIG. 6, the ECU 8 issues a command of stopping the drive of the electric motor and thereby instantly stops the electric motor. At the same time the ECU 8 changes the polarity of the electric motor and reverses the drive direction of the power sliding door 1 in an open direction. And if the power sliding door 1 returns to an open position, the ECU 8 stops the drive of the electric motor. Thus the processing of one cycle ends.

In the steps S3' and S4' the ECU 8 can detect with non contact/contact any pinch in the object 6's such as a human body nearing the power sliding door 1 and directly contacting the capacitance sensor 3 of the door 1 by the first detection electrode A and the second detection electrode B. Therefore, comparing a difference value with any set threshold in non contact and contact, the ECU 8 can determine the presence or absence of the pinch of the object 6 in the power sliding door 1. Thus because when the ECU 8 determines the pinch, it is designed to issue a command for changing the drive direction of the electric motor and to instantly reverse the close progression of the power sliding door 1, the ECU 8 can prevent any pinch of the object 6 such as a human body, which exists between the center pillar 2 and the power sliding door 1 and nears the capacitance sensor 3 at the end of the door 1.

In each of the steps of the control flow, if the ECU 8 does not detect abnormality, the power sliding door 1 continues on driving by the electric motor and completes closing. If the closing of the power sliding door 1 is completed, the power supply is shut off, and the electric charge charged in the first reference electrode CR 1 and the second reference electrode CR 2 is discharged.

Although in the capacitance sensor 3 of the embodiment thus described is described an example that the capacitance sensor 3 is applied to the pinch prevention apparatus between the power sliding door 1 and center pillar 2 of an automobile, the present invention is not limited thereto and is applicable to a pinch prevention apparatus between a movable part and holding part of a vehicle.

What is claimed is:

1. A capacitance sensor connected to a vehicle, comprising;
    a sensor unit connected to the vehicle that includes first and second detection electrodes and an insulation member;
    the first and second detection electrodes are connected to respective reference capacitors; and the first and second detection electrodes are mounted so that they are spaced from each other so that they are separated by a gap, and mounted so that the first and second detection electrodes can contact each other; and
    the insulation member supports the first detection electrode in a manner that allows the first detection electrode to move toward the second detection electrode a sufficient distance to allow the first detection electrode to contact the second detection electrode,
    wherein during detecting an object when the object nears the sensor, the first and second detection electrodes are spaced from each other a first distance, and
    wherein during detecting an object when the object contacts the sensor, the first and second detection electrodes are moved closer together to decrease the first distance.

2. A capacitance sensor according to claim 1, wherein the insulation member defines a closed space, and the first and second detection electrodes are positioned so as to contact each other within the closed space.

3. A capacitance sensor according to claim 2 further comprising a shield electrode that at least partially surrounds said first and second detection electrodes, and the shield electrode has the same electric potential as each of said first and second detection electrodes.

4. A capacitance sensor according to claim 3, wherein the shield electrode defines an opening, and at least one of the detection electrodes is provided at a position corresponding to the opening of said shield electrode.

5. A capacitance sensor according to claim 4, further comprising a trim unit adjacent the sensor unit, the trim unit being configured to attach the sensor unit to a movable part of the vehicle.

6. A capacitance sensor according to claim 2, further comprising a trim unit adjacent the sensor unit, the trim unit being configured to attach the sensor unit to a movable part of the vehicle.

7. A capacitance sensor according to claim 3, further comprising a trim unit adjacent the sensor unit, the trim unit being configured to attach the sensor unit to a movable part of the vehicle.

8. A capacitance sensor according to claim 1, further comprising a shield electrode that at least partially surrounds said first and second detection electrodes, and the shield ejectrode has the same electric potential as each of said first and second detection electrodes.

9. A capacitance sensor according to claim 8, wherein the shield electrode defines an opening, and at least one of the detection electrodes is provided at a position corresponding to the opening of said shield electrode.

10. A capacitance sensor according to claim 9, further comprising a trim unit adjacent the sensor unit, the trim unit being configured to attach the sensor unit to a movable part of the vehicle.

11. A capacitance sensor according to claim 8, further comprising a trim unit adjacent the sensor unit, the trim unit being configured to attach the sensor unit to a movable part of the vehicle.

12. A capacitance sensor according to claim 1, further comprising a trim unit adjacent the sensor unit, the trim unit being configured to attach the sensor unit to a movable part of the vehicle.

13. The capacitance sensor according to claim 1, wherein a portion of the insulation member upon which the first detection electrode is supported is flexible to allow the first detection electrode to move toward the second detection electrode.

14. A capacitance sensor according to claim 1 wherein the sensor is configured to detect any of a nearing and contact of an object, wherein detection of nearing and contact of an object are based on a difference value between an electric potential of the first detection electrode and that of the second detection electrode.

15. A capacitance sensor according to claim 14, wherein the sensor is configured to detect object nearing depending on whether the difference value is larger than an upper threshold limit, and the sensor is configured to detect object contacting depending on whether the difference value is smaller than a lower threshold limit.

16. A capacitance type object detection method for detecting an object near or contacting a movable part of a vehicle, the method comprising:
    detecting the object when the object nears the movable part of the vehicle based on a change of capacitance using a capacitance sensor that includes a first detection electrode and a second detection electrode;
    detecting the object when the object contacts the movable part of the vehicle and deforms the capacitance sensor, based on a change of capacitance that results from deforming the capacitance sensor;
    detection of nearing and detection of contact of an object are based on a difference value between an electric potential of the first detection electrode and that of the second detection electrode;
    detection of nearing and detection of contact are performed using different threshold limits for detection of nearing and detection of contact; and
    detecting object nearing depending on whether the difference value is larger than an upper threshold limit, and detecting object contacting depending on whether the difference value is smaller than a lower threshold limit.

* * * * *